United States Patent [19]

Vella-Coleiro

[11] Patent Number: 5,613,234
[45] Date of Patent: Mar. 18, 1997

[54] RECEIVE FILTER USING FREQUENCY TRANSLATION FOR OR IN CELLULAR TELEPHONY BASE STATION

[75] Inventor: George P. Vella-Coleiro, Summit, N.J.

[73] Assignee: Lucent Technologies Inc., Murray Hill, N.J.

[21] Appl. No.: 330,889

[22] Filed: Oct. 28, 1994

[51] Int. Cl.⁶ .................................................. H04B 1/10
[52] U.S. Cl. ........................ 455/340; 455/289; 455/303; 455/307; 455/276.1; 455/137
[58] Field of Search .................... 455/296, 302, 455/303, 307, 131, 132, 137, 276.1, 340, 289, 73; 375/349

[56] References Cited

U.S. PATENT DOCUMENTS

| | | | |
|---|---|---|---|
| 3,605,012 | 9/1971 | Kubanoff | 455/303 |
| 4,639,786 | 1/1987 | Tamer et al. | 455/307 |
| 4,696,055 | 9/1987 | Marshall | 455/302 |
| 5,223,809 | 6/1993 | Myer | 333/136 |
| 5,274,347 | 12/1993 | Bobadilla | 333/203 |

*Primary Examiner*—Andrew Faile
*Assistant Examiner*—Doris To

[57] ABSTRACT

A device for filtering wide-band signals at radio frequencies is usable either in a base station cellular telephony system or separately. The wide-band signal occupies a total frequency band comprising frequency bands allocated to that signal and a central frequency band extraneous to that wide-band signal. Within the device, the wide-band signal is mixed with a heterodyne wave to translate the signal from RF to IF. The signal at IF is then filtered by two surface acoustic wave (SAW) band-pass filters which have respective pass bands which correspond at IF to the allocated frequency bands of the wide-band signal, and which the SAW filters have the filtering effect of passing with low attenuation signals in those allocated bands while substantially attenuating signals and/or noise in the central extraneous frequency band between those allocated bands. The wide-band signal after being so filtered either remains at IF when supplied from the device or, in a subsequent stage of the device, is again mixed with the heterodyne wave to be restored back to RF. The heterodyne wave may be adjustable in frequency.

6 Claims, 4 Drawing Sheets

BASE STATION RECEIVE FREQUENCY ALLOCATION

WIRE-LINE FILTER DEVICE

WIRE-LINE FILTER DEVICE

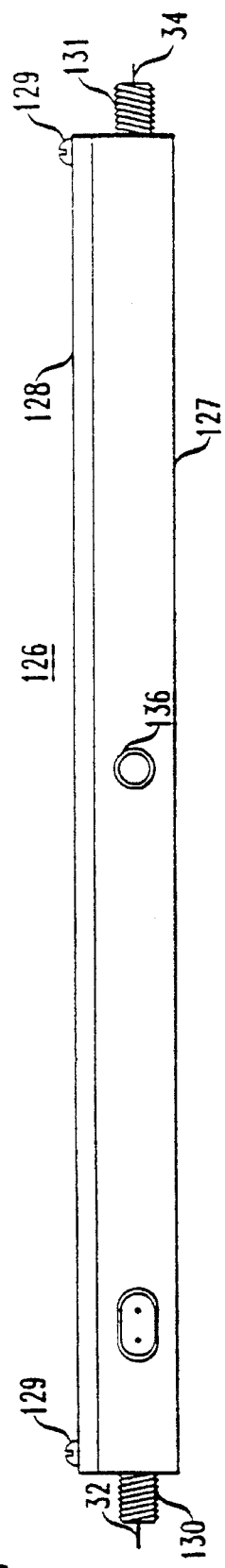
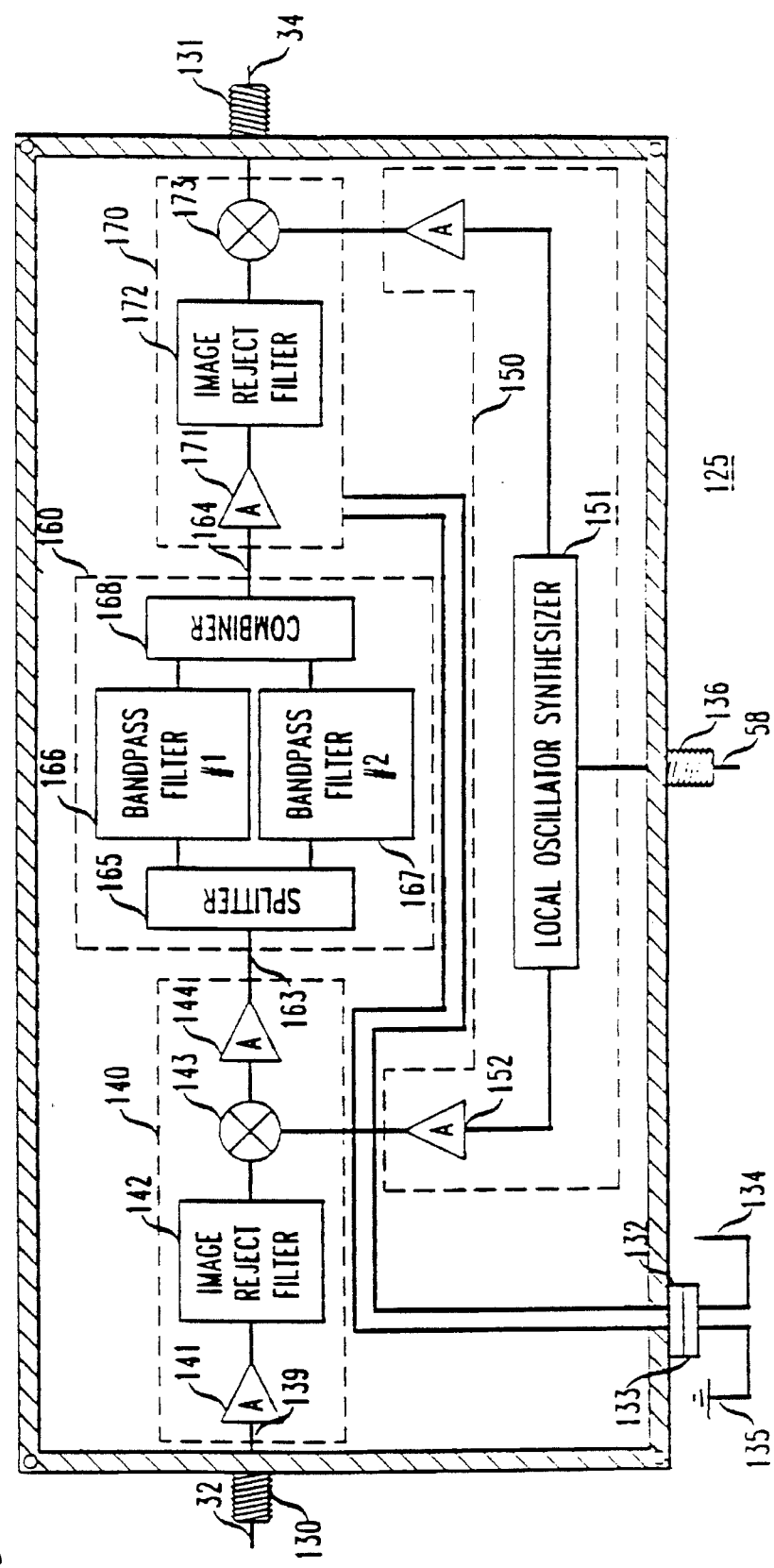
FIG. 5
FIG. 6

5,613,234

RECEIVE FILTER USING FREQUENCY TRANSLATION FOR OR IN CELLULAR TELEPHONY BASE STATION

FIELD OF THE INVENTION

This invention relates generally to base station transmit-receive systems used in cellular telephony. More particularly, this invention relates to systems of such kind providing improved filtering of signals received by the system.

BACKGROUND OF THE INVENTION

Telecommunication is effected with cellular telephony base station transmit-receive systems by (a) transmission signals propagated through space from the station and occupying a wide-band of frequencies and (b) reception signals propagated through space to the station and occupying a wide-band of frequencies different from that occupied by the wide-band transmission signals. Both the wide-band transmission signal and the wide-band reception signal are at RF frequencies and are subdivided into the same number X of smaller frequency bands which, although different in frequency, respectively correspond to each other one-to-one, and which respectively provide for the system X channels for conducting respective channel signals representing different conversations. In the use of the system, the smaller frequency "channel" bands in, respectively, the wide-band transmission and reception signals and corresponding to only one channel are occupied from time to time by, respectively, transmission channel signals and reception channel signals for that one channel.

In the case of wide-band reception signals, those signals may be of two kinds, namely, main wide-band reception signals, and diversity wide-band reception signals received by, respectively, a main antenna and a diversity antenna for the base station system. Both such main and diversity wide-band reception signals occupy the same wide frequency bands and differ from each other only in respect of the antennas by which they are received.

To restate the above, a base-station transmit-receive system utilizes X channels of which each channel is different in the frequency bands employed therefor from any other of such X channels, each of the X channels being provided by (a) a channel frequency band therefor within the wide-band transmission signal,. (b) a different channel frequency band therefor within the wide-band main reception signal, and (c) another channel frequency band therefor (the same in frequency as the mentioned channel band within the wide-band main reception signal) which is within a wide-band diversity reception signal in the event the system provides for diversity reception. As indicated above, "transmission channel signals" and "receiver channel signals" are signals which are contained within particular respective channel bands, and which convey conversations to be transmitted and received, respectively, by the base station. There may be two species of receiver channel signals, namely, "main receiver channels" and "diversity receiver channel signals".

Because of peculiarities in allocating frequencies for use in cellular telephony, the wide-band reception signal for any cellular telephony base station spans an interval in the frequency spectrum which includes, on the one hand, bands of frequencies allocated to that signal and containing the X channels therefore (and wanted receiver channel signals in those channels) and, on the other hand, a central band of frequencies interposed between those allocated bands, and containing receiver channel signals which are unwanted because they are likely to interfere with the wanted receiver channel signals. An initial step, therefore, in the processing of the received signals has been to filter the wide reception signal while at RF frequencies to attenuate signals and/or noise components in that central frequency band by a substantial degree and, preferably, down to a level at which they are incapable of producing significant interference with the wanted receiver channel signals. In the past, however, the filtering devices used to effect such filtering have been bulky and expensive.

SUMMARY OF THE INVENTION

The aforementioned and other disadvantages of the filters and filtering used in prior art base station transmit-receive systems are overcome according to the invention, in one or more of its aspects, by improvements of the character set out by the claims at the end hereof.

BRIEF DESCRIPTION OF DRAWINGS

For a better understanding of the invention, reference is made to the following description of exemplary embodiments thereof, and to the accompanying drawings wherein:

FIG. 5 is a front elevation of an exemplary embodiment of an improved filtering device incorporated in the FIG. 1 system in lieu of the FIG. 3 or FIG. 4 filtering so as to provide an improvement;

FIG. 6 is a plan view in cross-section, taken as indicated by the arrows 6—6, in FIG. 5 of the FIG. 5 filtering device, such plan view including a schematic diagram of the circuitry of the FIG. 5 device.

Figure 1:
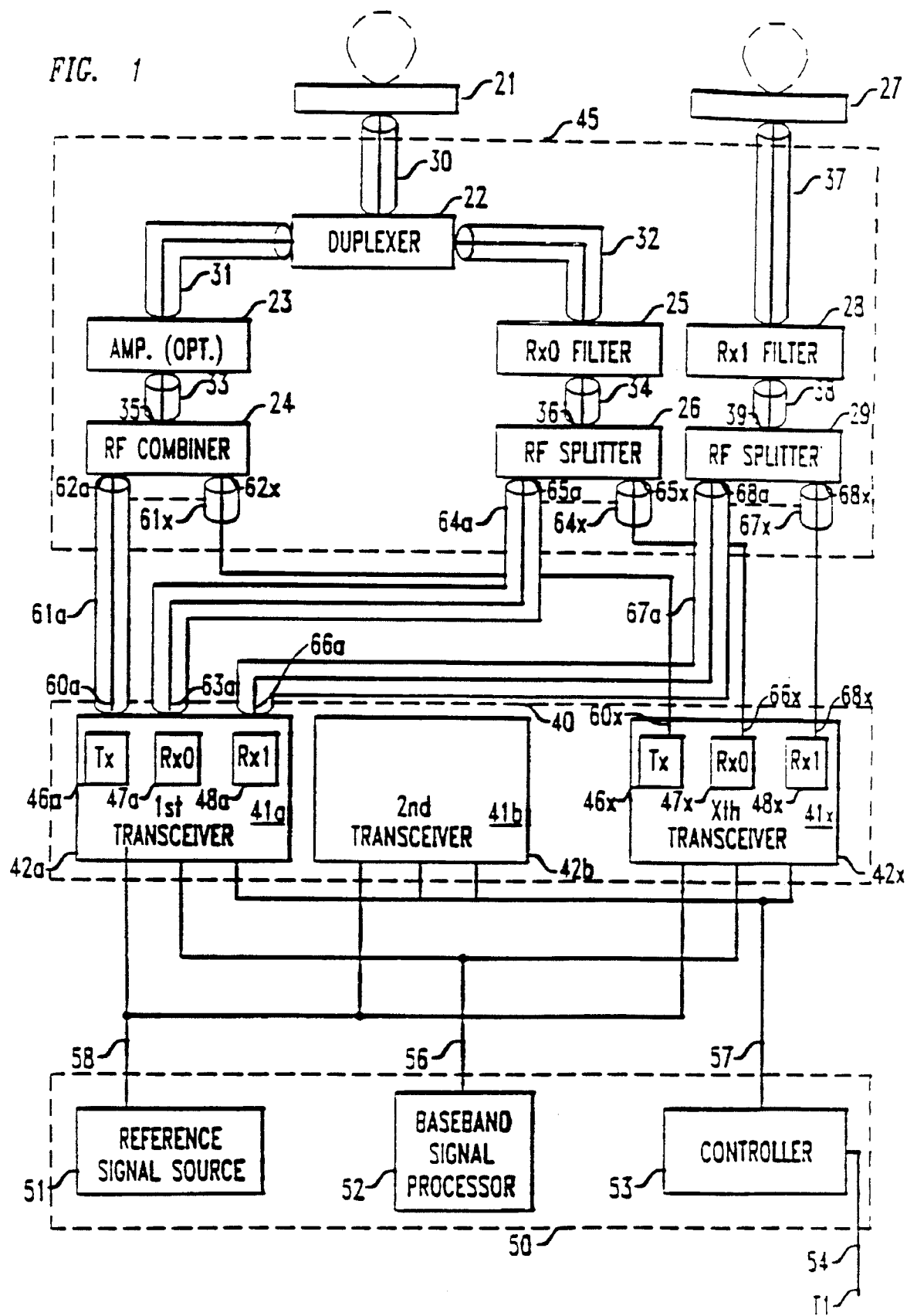
FIG. 1 is a schematic block diagram of a prior art base station cellular telephony transmit-receive system with X channels.

In the description which follows, elements which are counterparts of each are identified by the same reference numeral but are distinguished from each other by using different alphabetical suffixes for those numerals, and it is to be understood that a description of any of such elements applies, unless its context indicates otherwise, to each of its counterparts.

DESCRIPTION OF DETAILS OF EMBODIMENTS

Referring now to FIG. 1, the reference numeral 20 designates a prior art cellular telephony base station comprising a main antenna 21 for both transmission and reception, a duplexer 22, an optional amplifier 23 and combiner 24 on the transmission side, and an RXO filter 25 and splitter 26 on the reception side. Duplexer 22 may be the same as the duplexers disclosed in U.S. Pat. No. 5,274,347 issued Dec. 28, 1993 in the name of Omar J. Bobadilla for "Coaxial Fitting For Microwave Devices", and owned by the Assignee hereof, and in U.S. patent application Ser. No.

08/263,624, filed Jun. 22, 1994 in the name of Bobadilla et al for "Microwave Duplexer And Component", as a continuation of U.S. patent application Ser. No. 07/955,596, filed Oct. 10, 1992, both such application owned by the Assignee hereof. The combiner 24 and splitter 26 may each be provided by a "tree" of splitter-combiner devices which are of the kind disclosed in U.S. Pat. No. 5,223,809 issued Jun. 6, 1993 in the name of Robert E. Myer for "Signal Isolating Microwave Splitters/Combiners" and owned by the Assignee hereof.

Duplexer 22 is connected by coaxial cables 30, 31 and 32 to, respectively, the main antenna 21, the amplifier 23 and the filter 25. Coaxial cable 30 is included in a microwave transmission path between elements 21 and 22. Amplifier 23 and filter 25 are respectively connected by coaxial cables 33 and 34 to the single output terminal 35 of the combiner 24 and the single input terminal 36 of the splitter 26. The combinations of elements 31, 23 and 33 and of elements 32, 25 and 34 are included in separate microwave transmission paths between duplexer 22 and, respectively, the output terminal of combiner 24 and the input terminal 36 of splitter 26.

The FIG. 1 prior art system also includes a diversity antenna 27, an RX1 diversity filter 28 and a diversity splitter 29. The diversity antenna 27 is connected by a coaxial cable 37 to filter 28 which is in turn connected by a coaxial cable 38 to the single input terminal 39 of the splitter 29.

The circuits so far described and shown in FIG. 1 are included in a high frequency circuit section 45 which conveys high frequency signals at radio frequencies (without changing their frequency) between the antennas for the system and a channel signal processing section 40 comprising a plurality of transceivers 41 which are equal in number to the number X of channels characterizing the FIG. 1 system (X here being equal to 24), and which respectively correspond, one-to-one, to those X channels. It follows that the FIG. 1 system has twenty-four transceivers 41, but, for convenience, FIG. 1 shows only the transceiver 41a for the first channel, the transceiver 41b for the second channel and the transceiver 41x for the 24th channel. Transceiver 41a is typical of all the other transceivers 41.

The transceiver 41a includes within a common housing 42a separate transmitter, main receiver and diversity receiver channel circuits 46a, 47a and 48a which separately function in relation to respectively the transmitter channel signal, the main receiver channel signal and the diversity receiver channel signal for the first channel of the FIG. 1 system. The term "channel circuits" as used herein is generic to transmitter channel circuits 46, main receiver channel circuits 47, and diversity receiver channel circuits 48.

Transceiver 41b for the second channel includes, within a common housing 42b therefor, separate transmitter channel circuits and main and diversity receiver channel circuits (none shown) which are counterparts for the second channel of (and function the same for that channel as), respectively, the circuits 46a, 47a and 48a for the first channel. Transceiver 41x for the Xth channel (i.e., the 24th channel) includes within a common housing 42x therefor, and as separate circuits a transmitter channel circuit 46x, a main receiver channel circuit 47x and a diversity receiver channel circuit 48x. The circuits 46x–48x are counterparts for the Xth channel of (and function the same for that channel as), respectively the circuits 46a–48a for the first channel. The channel signal processing section 40 includes of, of course, not only the transceivers 41a, 41b and 41x for the first, second and 24th channels for the system, but also counterpart transceivers (not shown) which are counterparts of transceiver 41a and are respective to the third through twenty-third channels for the system.

The FIG. 1 system has, in addition to the high frequency circuit section 45 and the channel signal processing section 40, a pre-channel circuit section 50 comprising a reference signal source 51, a baseband signal processor 52 and a controller 53. The signals incoming to and outgoing from the system are in the form of T1 carrier signals depicted in FIG. 1 as being transferred on wiring 54 connected to controller 53.

The transmitter channel units 46a and 46x have respective output terminals 60a, 60x which are respectively connected by the coaxial cables 61a, 61x to the corresponding input terminals 62a, 62x of the combiner 24. Further, the main receiver channel circuits 47a and 47x have respective input terminals 63a, 63x respectively connected by the coaxial cables 64a, 64x to corresponding output terminals 65a, 65x of the main splitter 26. Still further, the diversity receiver channel circuits 48a and 48x have respective input terminals 66a and 66x respectively connected by the coaxial cables 67a, 67x to corresponding output terminals 68a, 68x of the diversity splitter 29. In a similar manner, each of the other unshown transmitter channel circuits of the FIG. 1 system has an output terminal connected by a corresponding coaxial cable to a corresponding input terminal of combiner 24, and each of the other unshown main and diversity receiver channel circuits of the FIG. 1 system has an input terminal connected by a corresponding coaxial cable to a corresponding output terminal of the corresponding one of the main and diversity splitters 26 and 29 of the system.

The FIG. 1 system operates as follows. Consider first its operation in relation to incoming T1 signals which carry in TDMA format a multiplicity of baseband signals representing different conversations. Baseband processor 52 and controller 53 are each connected by wiring 56 and 57 respective thereto to each of the transceivers 41 to provide an interconnection of elements 56, 57 and 41 of such character that the various baseband "conversation" signals transported by the T1 carrier are assigned by the coordinated activities of circuits 52, 53 to selected different ones of the mentioned X-channels and are routed by way of wiring 56 to the transmitter channel circuits 46 respectively corresponding to those selected channels. Those transmitter channel circuits also receive from source 51 via wiring 58 a reference signal in the form of a high frequency wave of fixed frequency.

Each transmitter channel circuit 46 includes a synthesizer (not shown) which utilizes a phase locked loop arrangement to operate on the input reference signal to generate therefrom a high frequency channel carrier wave which is different in frequency from that reference signal and is also of different frequency for each of the twenty-four channels of the system. Within each of the circuits 46, the baseband signal transmitted thereto via wiring 56 is then modulated on the high frequency channel carrier wave generated as described in that circuit to produce a transmitter channel signal for the one of the X channels served by that circuit 46.

The plurality of transmitter channel signals thus respectively produced by one, some or all the transmitter channel circuits 46 in section 40 are conveyed from the output terminals 60 of those circuits via coaxial cables 61 to the input terminals 62 of combiner 24 which respectively correspond to the last named output terminals. Within combiner 24, all those transmitter channel signals are added together to form at the output 35 of the combiner the earlier described wide-band transmission signal.

That wide-band signal is passed through cable 33 to amplifier 23 (if present) to be amplified thereby. The signal is then passed through cable 31, duplexer 22 and cable 30 to antenna 21 to be radiated therefrom and propagated through space to mobile cellular telephone sets located remotely from base station 20.

Turning now to the reception function of station 20, signals in various ones or all of the X channels for that station are propagated through space from those mobile sets to antenna 21 to be detected thereby. Such concurrent detection of that aggregate of signals by antenna 21 constitutes, in effect, the reception by the antenna of the earlier described wide-band reception signal.

The received wide-band signal is passed through cable 30, duplexer 22 and cable 32 to filter 25 which serves to reduce passage past it of signals which are within the total bandwidth of the wide-band reception signal but not within any of its channel bands. From filter 25, the wide-band signal is passed via cable 34 to the input terminal 36 of splitter 26. Within the splitter, the single wide-band signal at its input is distributed among all of the splitter's output terminals 65 and then passed from all those terminals, via cables 64, to the input terminals 63 of all the receiver channel circuits 47.

The receiver channel circuits 47 are each provided not only with an input, as described, of the wide-band reception signal but also with inputs via wiring 58, and 57, respectively, of the reference signal from source 51 and control signals from controller 53. Each such circuit 47 has therein a synthesizer (not shown) which operates by the phase locked loop principle to generate from the reference signal a "demodulating" wave. Such "demodulating" wave operates under the control of the input signals thereto from controller 53, to mix with the wide-band reception signal input to that circuit 47 to recover from the wide-band signal the baseband signal communicated through that channel from the mobile set originating that baseband conversation signal.

The recovered baseband signal is then supplied, as an output from such circuit 47, via wiring 56, to the combination of the baseband signal processor 52 and controller 53. Such combination operates to incorporate the multiplicity of baseband signals, incoming thereto from various ones or all of the receiver channel circuits 47, into a T1 carrier signal outgoing from the FIG. 1 system on wiring 54.

In the described prior art system shown by FIG. 1, that portion of the system which provides for diversity reception (and which includes the diversity receiver channel circuits 48 in transceivers 41) is structured the same and operates in the same way as the portion of the system described above which provides for main reception. In other words, the earlier described elements 21, 30, 32, 25, 34, 36, 26, 65, 64 and 47 of the main receiver portion of the system have as respective counterparts the elements 27, 37, 28, 38, 39, 29, 68, 67 and 48 in the diversity receiver portion, and description herein of any of those earlier described elements is, unless its context indicates otherwise, to be taken as applying also to its latter named counterpart.

The FIG. 1 system has provisions therein for selecting and using the receiver channel signals derived from the diversity reception antenna 27 in lieu to those derived from the main antenna 21 when such signals from antenna 27 are stronger than those derived from antenna 21. Since such provisions are not part of the present invention they will not be described herein in detail.

In the FIG. 1 system, the wide-band transmission signal and wide-band reception signals for the system may occupy, for example, the frequency bands of 869–849 MHz and 824–849 MHz. The reference signal from reference source 51 may conveniently have a fixed frequency of 15 MHz, and the separate channel bands occupying the frequency spectrum within each of the wide-band transmission signal and wide-band reception signal are spaced 30 KHz apart. The channel bands in the wide-band transmission signal and wide-band reception signal which respectively correspond to each other in that they belong to the same channel are spaced 45 MHz apart.

The FIG. 1 system includes, among its components, transmitter apparatus and receiver apparatus. The transmitter apparatus comprises combiner 24 and the transmitter channel circuits 46 in transceivers 41. The receiver apparatus comprises main splitter 26, diversity splitter 29 and the main and diversity receiver channel circuits 47 and 48 in transceivers 41.

Figure 2:
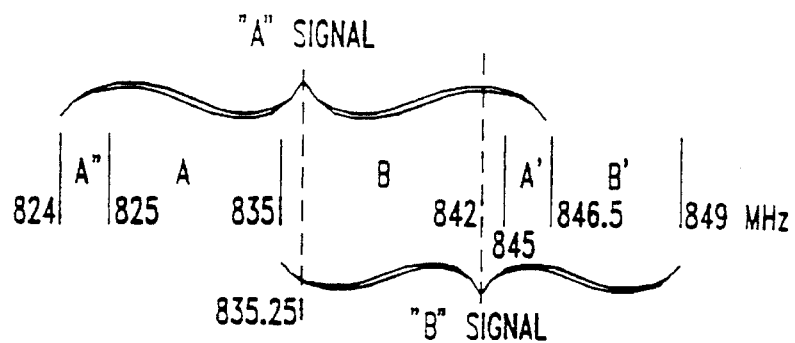
FIG. 2 is a frequency diagram showing the intervals occupied in the frequency spectrum by wide-band reception signals used in cellular telephony by, respectively, wire-line service providers and non-wire-line service providers.

In cellular telephony, the frequency spectrum allocated for cellular communications is divided between two service providers, wire-line and non-wire-line. The frequency allocation for base station receive is shown in FIG. 2 where the A, A' and A" bands are used by the non-wire-line service provider and the B and B' bands are used by the wire-line service provider.

To state it another way, the non-wire-line service provider utilizes for reception an "A" signal (FIG. 2) which has lower and upper frequency limits of 824 and 846.5 MHz, and which has a center frequency of 835.25 MHz. Those upper and lower limits define between them in the frequency spectrum an interval of 824-846.5 MHz which, for the purposes of the "A" signal, will be considered to be the total band at RF spanned by that signal. That band, however, includes in it not only the A, A' and A" frequency bands allocated to the "A" signal (and which, for that signal, contains its X channels and the wanted reception channel signals therein) but also a central B band of frequencies which is interposed between the A and A' bands allocated to the "A" signal. That B frequency band in the total band of the "A" signal is extraneous to that signal. Moreover, as the "A" signal is processed on the receiver side of the FIG. 1 system, the presence of any signals and/or noise of frequencies in the B band will, if allowed to remain at high enough level, interact with reception channel signals in the X channels of the "A" signal to cause such signal when reproduced as sound to be accompanied by significant audible interference. Thus, the presence in the "A" signal of electrical energy components of frequencies in the central B band therein is clearly unwanted.

Similarly, the wire-line service provider utilizes for reception a "B" signal for which the total band occupied thereby in the frequency spectrum extends at RF between 835 MHz and 849 MHz, the central frequency between them being at 842 MHz. That total band at RF for the "B" signal includes on the one hand, the shown (FIG. 2) B and B' frequency bands allocated to the wire-line service provider and containing for the "B" signal its X channels and the wanted reception channel signals therein and, on the other hand, a central band of frequencies which is interposed between the B and B' band, and which, in the case of the "B" signal, is the A' band of frequencies. For reasons analogous to those earlier discussed in connection with the "A" signal, the presence in the total band of the B signal of electrical energy components of frequencies in the A' band will, if allowed to remain at high enough level, cause reproduced reception channel signals of the "B" signal to be accompanied by audible interference. It follows that such energy components of frequencies in the A' band are unwanted constituents of the "B" signal as received at RF.

In order, therefore, to avoid one service interfering with another, it is necessary for each service provider, at a point early on in the base station processing of the wide-band reception signal utilized thereby, to substantially attenuate by filtering the central extraneous frequency band which appears in the total band spanned by that reception signal, but which in fact is used only by the other provider.

Figure 3:
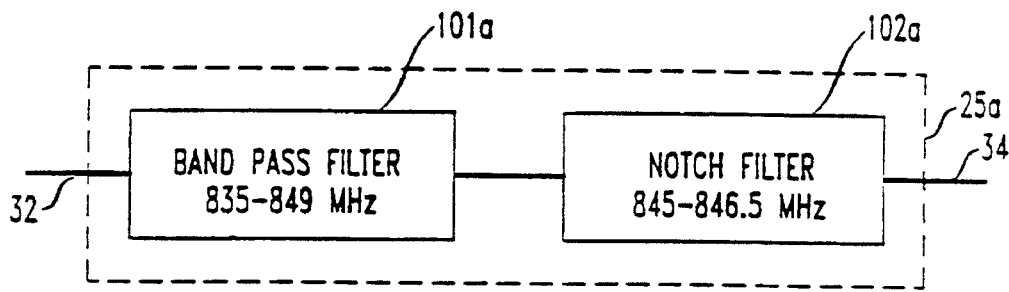
FIGS. 3 and 4 are respective block diagrams of prior art RF filter devices for filtering the wide-band reception signals used by, respectively, wire-line and non-wire-line service providers.
Figure 4:
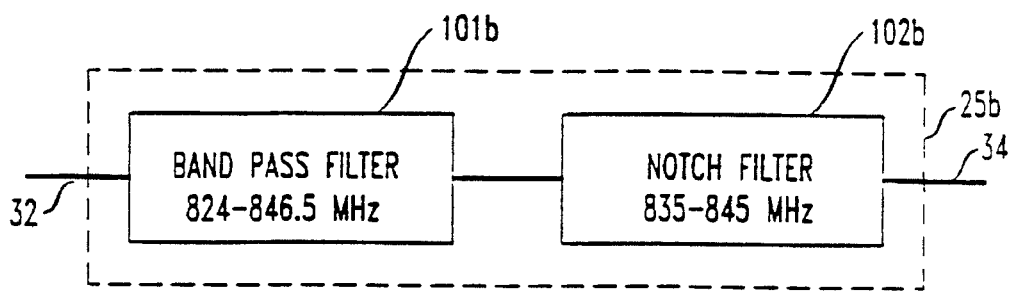

In the past, such filtering has been effected by having the filter device 25 of the FIG. 1 system take the form of device 25a or 25b each comprising the combination in series of an RF band-pass filter 101 followed by an RF notch filter 102 as shown in FIGS. 3 and 4. The FIG. 3 and FIG. 4 combinations are used where the wide-band reception signals are, respectively, the "B" signal used by the wire-line service provider and the "A" signal used by the non-wire-line service provider. In each of those combinations, the pass band of band-pass filter 101 is substantially the same as the total frequency band at RF spanned by the corresponding wide-band reception signal, whereas the rejection band of notch filter 102 is substantially the same as the central band of frequencies included in such total band at RF but extraneous to that wide-band reception signal. Thus, in the filter device 25a shown in FIG. 3 for filtering the "B" signal, the band-pass filter 101a has a pass band of 835–849 MHz and notch filter 102 has a rejection band of 845–846.5 MHz, whereas, in the filter device 25b shown in FIG. 4, for filtering the "A" signal, the band-pass filter 101b has a pass band of 824–846.5 MHz, and notch filter 102b has a rejection band of 835–845 MHz.

While filter devices 25a and 25b have performed satisfactorily, they have certain disadvantages. First, the band-pass filter and notch filter in each of those devices are both required to have extremely sharp cut-off characteristics, since there is no guard band between the wanted and unwanted bands in the "A" and "B" signals. Because of the sharp cut-off requirement and, also, to achieve low insertion loss so as not to degrade the carrier-to-noise ratio of the received signals, the resulting filter devices 25a and 25b are very bulky so as to require housings therefor for which the dimensions can be as great as about 18" long by about 4"–6" high by about 10"–12" deep when mounted on a shelf. Second, those filters, because of their size and their need to meet tight performance specifications have a cost which is undesirably high as, for example, in the order of $600–$800.

Such disadvantages of the prior art filters 25a or 25b used in the FIG. 1 and, of such system when using such filters, are overcome according to the invention by replacing such prior art filters by the filtering device shown in FIGS. 5 and 6 which is usable in the FIG. 1 system to improve it, but which filtering device is also usable in other applications thereof.

In FIGS. 5 and 6, the reference numeral 125 designates the mentioned improved filtering device comprising a metallic housing 126 consisting of a rectangular metallic box 127 having an open top and a rectangular metallic lid 128 fastened to box 127 by screws 129 and providing a closure for the top of the box. The box 127 has therein circuitry (to be described) mounted in the box by conventional insulative means (not shown) which electrically isolates such circuitry from the metal of the box and lid. That metal, on the other hand, shields such circuitry from stray electromagnetic interference.

Filtering device 125 at its left and right hand ends has input and output terminals 130 and 131 for the wide-band reception signal. Terminals 130 and 131 project out from housing 126 and take the form of conventional coaxial fittings to each of which one end of a coaxial cable may be electromechanically coupled by screwing a rotable sleeve (not shown) on that end of the cable onto external threading on that fitting. The fittings 130 and 131 are shown in FIGS. 5 and 6 as being coupled, respectively, to (FIG. 1) the coaxial cable 32 from the duplexer 22 and the coaxial cable 34 leading to the splitter 26.

The housing 126 also has on its exterior a jack 132 into which is shown inserted a plug 133 for providing DC power and ground connections from wiring 134, 135 to the housing's interior. Another element exteriorly mounted by housing 126 is an externally threaded coaxial fitting 136 to which (as schematically represented in FIG. 6) is coupled a coaxial cable forming part of the wiring 58 which (FIG. 1) supplies the reference signal from source 51 to various circuits in the FIG. 1 system.

The circuitry of the filtering device 125 is as follows. The device's terminal 130 is electrically coupled to one input 139 of a first mixer stage 140 comprising a plurality of circuits which are connected in series and which are, from left to right (FIG. 6), an RF amplifier 141, an image reject filter 142 (later described in more detail), a mixer circuit 143 and an IF amplifier 144. Mixer circuit 143 receives two wave inputs, one being the wide band reception signal supplied to it from terminal 130 through circuits 141 and 142, and the other input being supplied to it from a local oscillator stage 150.

Local oscillator stage 150 comprises a local oscillator synthesizer circuit 151 coupled to coaxial fitting 136 to receive an input therefrom of the reference signal from source 51. Synthesizer circuit 15 1 operates by the phase-locked principle to generate from the reference signal an electrical fixed-frequency wave which has a frequency different from the center frequency of the wide-band reception signal, and which (to borrow a term from earlier telecommunications technology) is referred to herein as a "heterodyne" wave. That heterodyne wave is supplied from synthesizer circuit 151 to left and right hand (FIG. 6) amplifiers 152 and 153 included in stage 150 to appear in amplified form at the output of each of them. The amplified heterodyne wave at the output of amplifier 152 is supplied as another input to the mixer circuit 143 in first mixer stage 140.

The signal produced by the first mixer stage is applied to a filter stage 160 having an input 163 and an output 164 and comprising the circuits (in order from left to right (FIG. 6) between input 163 and output 164) of: a 1:2 splitter 165 having a single input providing the input 163 for stage 160, two IF band-pass filters 166 and 167 respectively connected, on their left sides, to the two outputs of splitter 165, and a 2:1 combiner 168 having its two inputs connected respectively to the right sides of the filters 166 and 167, and having single output providing the output 164 for filter stage 160. As shown, the two IF band-pass filters 166 and 167 are effectively connected in parallel between the input 163 and output 164 of the filter stage 160.

The signal passed through the filter stage 160 is supplied from its output 164 to a stage which is referred to herein generically as a "signal transfer stage", and which conveys the signal at such output 164 through that stage to appear in the same or different form at the output terminal 131 of the filtering device 125. When that signal transfer stage is of the character shown by FIG. 6, the signal at the output of the stage has a different form than at the input of the stage, and the stage 170 constitutes a second mixer stage 170. Mixer stage 170 comprises a plurality of electrical circuits which are connected in series between filter stage output 164 and the device output terminal 131, and which are, respectively, an amplifier circuit 171, an image reject filter 172 and a second mixer circuit 173. Mixer circuit 173 receives two inputs, one being from the image reject filter 172 and the other from the output of the right hand amplifier 153 in the local oscillator stage 150.

Assuming that the signal applied to the input terminal 130 of device 125 is the "B" signal shown in FIG. 2, the principal operation of the filtering device 125 is as follows.

The "B" signal, after having been amplified and filtered in circuits 141 and 142, is mixed in the mixer circuit 143 with the heterodyne wave which is supplied by amplifier 152 of local oscillator stage 150 and which may conveniently have a fixed frequency of 720 MHz. The mixer circuit 143 responds in a well known manner to those two inputs thereto to effect frequency translation by producing, from the mixing (or beating together) therein of the two input waves thereto, two additional waves constituted-of, respectively, the sum frequencies and the difference frequencies of the two original waves. The difference frequency wave is the one of interest here and will be referred to herein as the wide-band reception signal at IF.

When the 720 MHz heterodyne wave beats in mixer circuit 143 with a signal component in the original "B" signal at RF and having a frequency of 835 MHz (which is at the lower frequency limit of the "B" signal), the effect of the beating action is, for the purposes of the difference wave, to shift or translate the frequency of that signal component downward by the amount of 720 MHz so that such particular signal component ends up with an intermediate frequency (or "IF") of 115 MHz. The same frequency shift or translation occurs in the difference wave for every other signal component of the "B" signal having frequencies above 835 MHz in the total band of 835 MHz to 849 MHz spanned by that "B" signal when at RF. Accordingly, the entire "B" signal is shifted down from the radio frequency (RF) range to the intermediate frequency range (IF). When so shifted, the "B" signal includes, as before, in its total band, its allocated B and B' bands and also the central extraneous A' band. Those bands have, however, all been shifted to intermediate frequencies so that the B band now occupies the interval 115–125 MHz, the B' band now occupies the interval of 126.5–129 MHz, and the extraneous A' band occupies the in-between interval of 125–126.5 MHz. In other words, the mixer circuit 143 serves to convert the original wide-band reception signal at RF into a wide-band reception signal at IF.

That signal is supplied from mixer stage 140 to filter stage 160 to be passed through the latter stage. In the course of such passage, the "B" wide-band reception signal at IF is filtered by the band-pass filters 166 and 167 which, for the purposes of that "B" signal, have respective pass bands of 115–125 MHz and 126.5–129 MHz, the same as the intervals occupied in the frequency spectrum by the B and B' bands of the "B" signal. Thus, reception channel signals in the X channels of the "B" signal will pass substantially unattenuated through the filters 166, 167. On the other hand, any signals and/or noise in the central extraneous A' band (of 125–126.5 MHz) in the "B", signal will have frequencies outside of the pass bands of the filters 166 and 167. In the course, therefore, of passage of the "B" signal through the filter stage 160, such extraneous signals and/or noise will be so attenuated as to be incapable of interacting with the channel signals to the degree of producing significant audible interference with those signals when reproduced as sounds.

The two band-pass filters 166 and 167 have the same filtering effect on the "B" signal at IF as the notch filter 102 of prior art filter 25A (FIG. 3) has on the "B" signal at RF. Thus, although filter stage 160 includes no real notch filter, it nonetheless functions the same as would a notch filter, and thus can be said aptly to be a virtual notch filter.

The band-pass filters 166 and 167 preferably (but not necessarily) take the form of surface acoustic wave (SAW) filters. Filters of such kind are well known to provide the needed sharp cut-off characteristics in the lower frequency range around 100 MHz and, also, are relatively small and inexpensive. Unfortunately such SAW filters are not available with sharp enough cut-off characteristics in the cellular frequency bands above 800 MHz.

The filtered "B" signal at the output 164 of stage 160 is next supplied to a stage of filtering device 125 which in that device, as shown in FIG. 6, is, as earlier stated, a second mixer stage 170. Within that stage, the filtered "B" signal passes through amplifier 171 and image reject filter 172 to mixer circuit 173 to serve as one input to that circuit, the other input to circuit 173 being the 720 MHz heterodyne wave from the amplifier 153 of local oscillator stage 150. The filtered "B" wide-band reception signal at IF (i.e., at and somewhat above 115 MHz) beats in circuit 173 with the 720 MHz heterodyne wave. The result is a "sum frequency" signal which appears at the output terminal 131 of device 125, and which replicates the original wide-band reception "B" signal at RF at the input terminal 130 of that device except that the "A" frequency components in the original "B" signal at terminal 130 have entirely or mostly been filtered out of that signal at terminal 131. To put it another way, since the heterodyne wave provides to each of the mixer stages 140 and 170 a local oscillator frequency which is identical for those stages, the original radio frequencies of the incoming "B" signal at input 130 are received precisely at output terminal 13 1, but the outgoing "B" signal from filtering device 125 is now substantially free of electrical energy frequency components in the A' band which are capable of interfering with channel signals in the B and B' bands of the "B" signal.

Since the "B" signal enters filtering device 125 at RF and leaves that device at the same RF, that device when viewed as a "block box" appears to function the same as the RF filter device 25 (FIG. 1). That is, judging just by how device 125 functions overall between its input and output terminals, there is nothing in the "B" signal frequency band which would make an observer aware that, within the housing 126 of device 125, the "B" signal is first translated down in frequency from RF to IF and then translated up in frequency from IF back to RF. Filtering device 125 can, therefore, be termed aptly a virtual RF notch filter.

Turning now to ancillary functions performed by circuits in the filtering device 125, the purpose of the amplifier 141 is to prevent the carrier-to-noise ratio (CNR) of the incoming wide-band reception signal from being degraded due to the conversion loss in the first mixer circuit 143 (typically 5 to 10 dB). Thus, this amplifier will typically have a gain approximately equal to or somewhat larger than the insertion loss of circuit 143.

The image reject filter 142 is a simple band-pass or high-pass filter which does not need to have a sharp cut-off characteristic since its purpose is to prevent noise or extraneous signals at and near 605 MHz from beating in mixer stage 143, with the 720 MHz heterodyne wave to thereby produce, by way of a "difference frequency wave", interference in the same IF range (at and near 115 MHz) as that occupied by the "B" signal at IF.

The image reject filter 172 in front of the second mixer circuit 173 is a low-pass filter which need not have a short cut-off characteristic, and which is utilized to prevent noise or extraneous signals at and near 1555 MHz from beating with the 720 MHz heterodyne wave to thereby produce, via a "difference frequency" wave, interference in the same RF range (835 MHz–849 MHz) as that occupied by the reconstructed filtered "B" signal at RF generated by that second mixer circuit.

Amplifiers 152 and 153 are utilized to buffer the synthesizer circuit 151 from the mixer circuits 143 and 173, to provide separate outputs for respectively supplying the heterodyne wave from circuit 151 to the two mixer circuits to thereby isolate from each other the respective operations of those circuits 143 and 173, and to add gain to the heterodyne wave.

While the circuit of filtering device 125 has been described above in connection with its use for filtering the "B" signal, the same circuitry may be used with only a slight modification to effect filtering in the same way of the "A" signal. Such modification is that, for processing the "A" signal, the band-pass filters 166 and 167 in filter stage 160 are replaced by corresponding band-pass filters (not shown) having respective pass bands of 104 MHz–115 MHz and 125–126.5 MHz. The first of those pass bands corresponds to the interval in the total band of the "A" signal occupied by its A" and A bands, whereas the second of those pass bands corresponds to the A' band in the "A" signal.

Further, while the filtering device 125 has been described above as a replacement for the main reception RX0 filter 25 of the FIG. 1 system, if that system also provides for diversity reception as shown in FIG. 1, a filtering device similar to device 125 may be used as a replacement for the diversity reception RX1 filter 28 shown in FIG. 1. Virtual RF notch filters of the character of filtering device 125 may be used not only to replace the conventional RX0 and RX1 RF filters in the FIG. 1 system but also to replace such conventional RF filters in the improved systems disclosed in my U.S. patent application, Ser. No. 08/299,466, filed Aug. 31, 1994 for "Improved Cellular Base Station Transmit-Receive System" and assigned to the assignee hereof.

Figure 7:
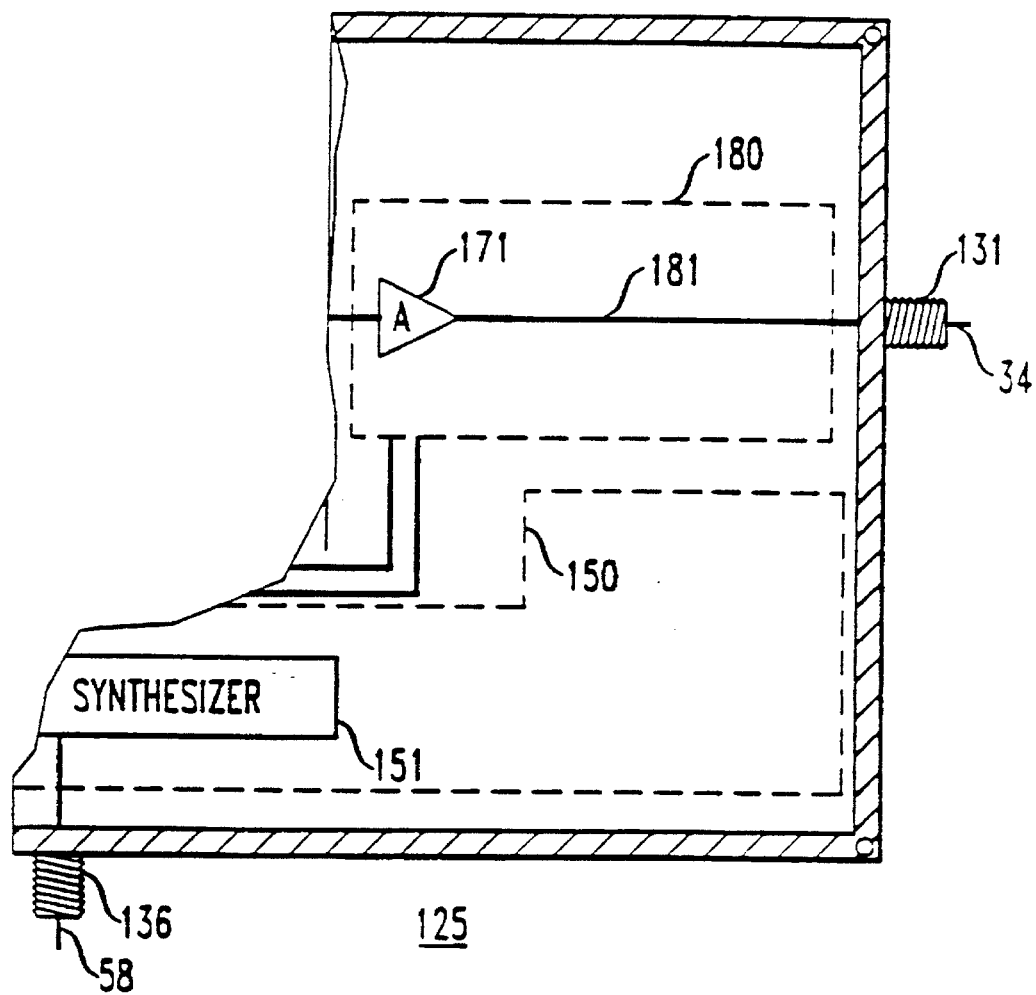
FIG. 7 is a plan view in cross-section of the right hand end of the FIG. 5 device as shown in FIG. 6 when circuitry included in that right hand end has undergone modification.

FIG. 7 shows a modification in the filtering device 125 in which its second mixer stage 170 (FIG. 6) is replaced by a signal transfer stage 180 comprising only the amplifier 171 and a coaxial line 181 connecting the output of amplifier 171 directly to the output terminal 131 of the device. Another change which has been made is that the amplifier circuit 153 of local oscillator stage 150 has been eliminated because it is now superfluous. When filtering device 125 has been modified as shown in FIG. 7, the signal appearing at the device's output terminal 131 is the "B" signal, or "A" signal, at IF, and such signals have useful applications at intermediate frequencies in base station cellular telephony systems.

When such IF signals are so used, the reference signal input for the local oscillator stage 150 is provided by the wiring 58 (FIG. 6) from reference signal source 51 (FIG. 1) to thereby meet a requirement that, for such output signals at IF from the FIG. 7 modification, the heterodyne signal used to translate those signals from RF to IF be locked in frequency with the reference input signals supplied to the transmitter channel circuits 46 and receiver channel circuits 47 and 48 in the FIG. 1 system. That requirement does not hold, however, for the unmodified filtering device shown in FIG. 6 which is a "virtual RF filtering device" (in the sense that the incoming signals to the device are at radio frequencies, and while translated in the device down to IF for filtering, are, after filtering, restored to their original radio frequencies and, for which device, the heterodyne wave from the local oscillator stage 150 (and, hence, the reference signal on input 136 to that stage) can be floating in frequency in relation to the reference signal supplied by the source 51. The ability, when device 124 is a virtual RF filtering device to have its heterodyne wave and reference signal to its input 136 to be so floating in frequency is advantageous and enables such virtual RF filter device to have numerous applications which are other than just use in a base station cellular telephony system as has been described above, and which are later mentioned.

Some advantages of the filtering device 125 over the RX0 and RX1 prior art RF filters 25 and 28 shown in FIG. 1 are as follows. First, filtering device 125 can be made very compact so as to fit within a housing 126 measuring only 6"×6"×1". Second, the cost of a filtering device the same as or similar to device 125 can be as low as about $300 so as to be only about one-half or less of the cost of the RF filter devices of the type now used in base station cellular telephony systems and exemplified by filters 25 and 28 (FIG. 1). Third, a filtering device having a circuitry of device 125 is usable as a virtual RF filter which is capable of being tuned to filter RF signals occurring at widely different frequency locations in the RF frequency range while concurrently benefiting from the use of one or more low cost SAW filters with sharp frequency cut-off characteristics at IF to provide the filtering. Such tuning of device 125 can be effected by the simple expedient of adjusting (as can readily be done) the local oscillator frequency provided by the heterodyne wave output from local oscillator 150. One way of adjusting such frequency is by utilizing an adjustable frequency signal (not shown) connected to input 136 to supply the reference signal input to stage 150, and changing the frequency setting knob of that source to adjust as desired the frequency of that reference signal. In such applications, one or more SAW filters can be used in filter stage 160 to provide either a virtual notch filter effect (as earlier described) or a single band-pass filter effect or other filter effects. While in that case the pass band of each of those one or more SAW filters remains fixed at intermediate frequencies, as a result of (a), taking the steps in device 127 of first converting the incoming signal form RF to IF, then filtering it, and then converting the signal back to RF to replicate itself except for being filtered, and (b) taking the further step of adjusting the local oscillator frequency provided by the heterodyne wave from stage 150, the device 125 can be made, by, using the filtering action at IF of the one or more SAW filters therein, to, in effect, provide a corresponding RF signal filtering action over a large range of locations for RF signals in the RF frequency range.

The above-described embodiments being exemplary only, it is to be understood that additions thereto, omissions therefrom and modifications thereof can be made without departing from the spirit of the invention. Accordingly, the invention is not to be considered as limited save as is consonant with the recitals of the following claims.

I claim:

1. The improvement in a base station cellular telephone transmit-receive system comprising: antenna means for radiating and detecting, respectively, first and second wide-band microwave transmission and reception signals each subdivided into smaller frequency bands providing a plurality of channels common to said first and second signals, and for conveying different conversations in said channels, and said wide-band reception signal having a center frequency and being initially at radio frequencies ("the wide-band reception signal at RF"); and having lower and upper frequency limits defining between them in the frequency spectrum an interval including frequency bands allocated to said wideband reception signal at RF and a central band of frequencies extraneous to that signal and interposed between such allocated frequency bands, transmitter apparatus comprising, a plurality of transmitter channel circuits respectively corresponding to said channels and having respective output terminals in a set thereof, said transmitter channel circuits being responsive to baseband signals and operable to produce at said terminals a plurality of modulated carrier transmitter channel signals respective to and for said plurality of channels in said first signal, and said transmitter apparatus further comprising a signal combiner having an output terminal and a set of input terminals numerically corresponding to and coupled to said output terminals of said transmitter circuits, said combiner being responsive to concurrent applications of transmitter channel signals to corresponding ones of said input terminals to combine such signals into said first wide-band transmission signal and deliver said first signal to said combiner's output terminal, receiver apparatus comprising a signal splitter having an input terminal and a set of output terminals respectively corresponding to said channels in said second wide-band reception signal, said splitter being responsive to application to its input terminal of said second signal to distribute that signal to appear at each of said splitter's output terminals, said receiver apparatus further comprising a plurality of receiver channel circuits having respective input terminals in a set thereof and numerically corresponding to and coupled to said output terminals of said splitter to have said second signal appear at the last named input terminals, said receiver channel circuits being operable to recover baseband signals from said second signal appearing at said input terminals thereof, and a duplexer having a T-junction coupled by first and second microwave transmission paths to, respectively, said output terminal of said combiner and said input terminal of said splitter, and coupled by a third microwave transmission path to said antenna means, said improvement comprising: a wave filtering device having input and output terminals and interposed in said second microwave transmission path between said T-junction and said input terminal of said splitter to have said device's input and output terminals electrically coupled to, respectively said T-junction and said splitter input terminal, a local oscillator stage which is a source of an electrical fixed-frequency heterodyne wave having a frequency different from the center frequency of said wide-band reception signal at RF, a mixer stage electrically coupled to said device's input terminal and to said local oscillator stage to receive respective inputs thereto of said wide-band reception signal at RF and said heterodyne wave, said mixer stage being responsive to said inputs thereto to convert said wide-band reception signal at RF to a wide-band reception signal in which the center frequency of that signal has been shifted from its initial radio frequency value down to a frequency value in the range of intermediate frequencies so as to become a wide-band reception signal at IF, a filtering stage coupled to the mixer stage to receive therefrom said wide-band reception signal at IF and to attenuate passage through said filtering stage of electrical energy components of frequency in said central extraneous band of frequencies for said wide-band reception signal at IF while, concurrently, passing with less attenuation through said filtering stage, electric signal components of frequencies in said allocated frequency bands, and signal transfer means coupled between said filtering stage and said device's output terminal for supplying to that terminal said wideband reception signal as so filtered by said filtering stage, and at a selected frequency for the center frequency of said wide-band reception signal.

2. The improvement according to claim 1 in which said filtering stage comprises a plurality of band-pass filters coupled in parallel between said mixer stage and said signal transfer means, said band-pass filters having respective pass bands which respectively correspond to the allocated frequency bands for said wide-band reception signal at IF.

3. The improvement according to claim 2 in which each of said bandpass filters is a surface acoustic wave (SAW) filter.

4. The improvement according to claim 1 in which said signal transfer means comprises a multiconductor transmission line coupled between said filtering stage and said device's output terminal for conducting said wide-band reception signal at IF from the former to the latter.

5. The improvement according to claim 1 in which said mixer stage is a first mixer stage, and in which said signal transfer means comprises a second mixer stage coupled to all of said device's output terminal and said local oscillator stage and said filtering stage to receive such two stages respective inputs of said heterodyne wave and said wideband reception signal at IF, said second mixer stage being responsive to said inputs thereto to recover from said wide-band reception signal at IF and deliver said device's output terminal a wide-band reception signal at RF which is the same except for being filtered, as described, as said wide-band reception signal at RF at said device's input terminal.

6. A device for filtering a signal which is an electrical wave signal which has a center frequency and lower and upper frequency limits defining between them in the frequency spectrum an interval including bands of frequencies allocated to said signal and, also, a central band of frequencies extraneous to said signal and interposed between such allocated frequency bands, said center frequency and frequency limits of said signal initially being at radio frequencies so that said signal is initially the wave signal at RF, and said device comprising: an input terminal for receiving said wave signal at RF, a local oscillator stage which is a source of an electrical fixed-frequency heterodyne wave having a frequency different from the center frequency of said wave signal at RF, a first mixer stage electrically coupled to said input terminal and said local oscillator stage to receive respective inputs therefrom of said wave signal at RF and said heterodyne wave, said first mixer stage being responsive to said inputs thereto to convert said wave signal at RF into an electrical wave signal which has a center frequency and lower and upper frequencies shifted down to become intermediate frequencies, while continuing to have at said intermediate frequencies said allocated frequency bands and central extraneous frequency band of said electrical wave signal, so as to thereby be a wave signal at IF, a filtering stage coupled to said first mixer stage to receive therefrom said wave signal at IF and to attenuate passage through said filtering stage of electrical energy components of frequencies in said central extraneous band for said wave signal at IF while, concurrently, passing with less attenuation through said filtering stage electrical signal components of frequencies in said allocated frequency bands, and a second mixer stage electrically coupled to said local oscillator stage and said filtering stage to receive therefrom respective inputs of said heterodyne and said wave signal at IF as so filtered by said filtering stage, said second mixer stage being responsive to those inputs thereto to derive therefrom an electrical wave signal which replicates said initial wave signal at RF except that such signal has been filtered as described.

\* \* \* \* \*